(12) United States Patent
Tang et al.

(10) Patent No.: US 7,545,205 B2
(45) Date of Patent: Jun. 9, 2009

(54) LOW POWER ON-CHIP GLOBAL INTERCONNECTS

(75) Inventors: Robin Tang, San Jose, CA (US); Ephrem C. Wu, San Mateo, CA (US)

(73) Assignee: LSI Corporation, Milpitas, CA (US)

( * ) Notice: Subject to any disclaimer, the term of this patent is extended or adjusted under 35 U.S.C. 154(b) by 46 days.

(21) Appl. No.: 11/924,791

(22) Filed: Oct. 26, 2007

(65) Prior Publication Data

US 2009/0108925 A1 Apr. 30, 2009

(51) Int. Cl.
*H01L 25/00* (2006.01)
(52) U.S. Cl. ...................................... 327/565; 327/291
(58) Field of Classification Search ................. 327/291, 327/292, 293, 295, 296, 297, 299, 564, 565
See application file for complete search history.

(56) References Cited

U.S. PATENT DOCUMENTS

| | | | |
|---|---|---|---|
| 6,426,656 B1 | 7/2002 | Dally et al. | 327/51 |
| 6,614,268 B2 | 9/2003 | Dally et al. | 327/51 |
| 6,735,130 B2* | 5/2004 | Fan et al. | 365/198 |
| 6,801,081 B2* | 10/2004 | Gloaguen et al. | 327/565 |
| 6,836,290 B1* | 12/2004 | Chung et al. | 348/294 |
| 7,245,173 B2* | 7/2007 | Krasnansky | 327/379 |

* cited by examiner

*Primary Examiner*—Jeffrey S Zweizig
(74) *Attorney, Agent, or Firm*—Christopher P. Maiorana, PC (57) ABSTRACT

An apparatus including a first circuit, a second circuit and a third circuit. The first circuit may be configured to (a) receive (i) a plurality of input signals and (ii) a clock signal and (b) present (i) a plurality of low-swing differential signals and (ii) a full-swing differential signal. The second circuit may be configured to (a) receive (i) the plurality of low-swing differential signals, (ii) the full-swing differential signal and (iii) the clock signal and (b) present a plurality of output signals. The third circuit may be configured to communicate the plurality of low-swing differential signals and the full-swing differential signal from the first circuit to the second circuit. The third circuit may be further configured to generate a local clock in response to the full-swing differential signal.

20 Claims, 6 Drawing Sheets

LOW POWER ON-CHIP GLOBAL INTERCONNECTS

FIELD OF THE INVENTION

The present invention relates to integrated circuit design generally and, more particularly, to low power on-chip global interconnects.

BACKGROUND OF THE INVENTION

In conventional networking application and other digital systems, high frequency (>1 GHz), high bandwidth data signals are common. A conventional technique for moving data on-chip is to drive full-swing signals to the wires. To reduce propagation delay due to parasitic resistance and capacitance on the wires, repeaters are added at frequent intervals. The addition of repeaters at frequent intervals can create power consumption and signal integrity concerns when, for example, a thousand signals drive 10 mm wires simultaneously. A conventional solution is to use low voltage swing signals on the wires to reduce the power consumption. However, the conventional solution uses a very low skew clock for sense amplifiers in the repeaters to read data from the low voltage swing signals.

Figure 1:
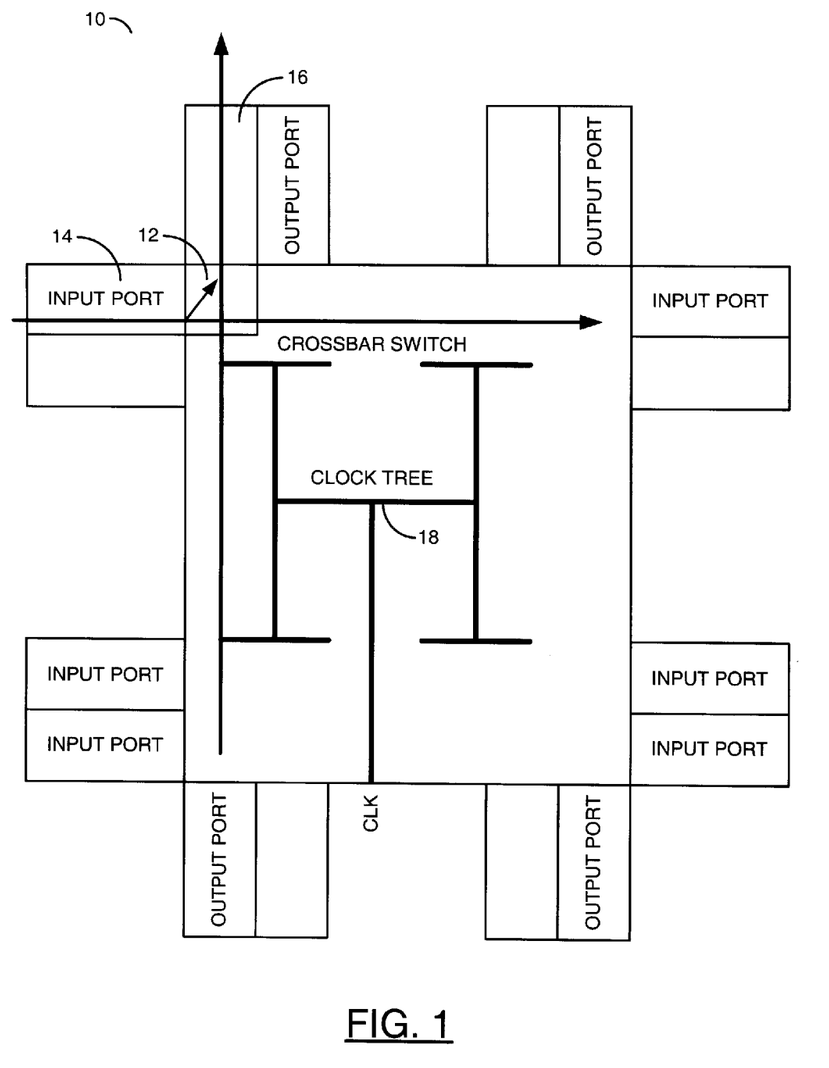
FIG. 1 is a diagram illustrating a crossbar switch with a balanced clock tree.

Referring to FIG. 1, a diagram is shown illustrating a crossbar (Xbar) switch 10 with a low skew clock CLK. The crossbar switch 10 has a number of switches (or multiplexers) 12 that direct data from any input port 14 to any output port 16 according to addresses provided by a system arbitrator. In the crossbar switch 10, the input data moves horizontally while the output data moves vertically. Each of the switches 12 in the crossbar switch 10 receives data from an input port 14 and propagates the data to an output port 16 when selected. All the switch operations including the input ports and output ports are synchronized by the low skew clock CLK.

The conventional way to implement the low skew clock CLK is to use a balanced clock tree 18. Each tap on the clock tree 18 has the same delay and output loading to produce the low skew clock CLK. The main reason for the clock tree 18 is to reduce the clock skew and synchronize operation of the circuit. For example, a falling edge of the low skew clock CLK can start pre-charging of the horizontal wires while a rising edge of the clock launches data propagation, and vice versa for the vertical wires.

There are drawbacks to using the balanced clock tree 18. One drawback is the duty cycle of the clock. The duty cycle of the clock can be less than ideal (50%-50%). A less than ideal duty cycle of the clock either reduces the time allowed for data propagation or pre-charging the wires. For example, for a 1 GHz clock with a 40-60 duty cycle (i.e., 40% HIGH and 60% LOW), the HIGH clock drives the horizontal wires in 400 ps while the LOW clock drives the vertical wires in 600 ps. When horizontal wires have the same length as the vertical wires, the slack time to drive the horizontal wires can be less than the vertical wires and performance can be reduced.

Another drawback of using the balanced clock tree 18 is the clock tree power consumption. To reduce the clock skew, many buffers/repeaters are placed along the wires to reduce the transition time of the clock waveforms as well as the fanout. The power consumption from the clock tree 18 alone can contribute a significant portion of the total power consumption of the switch 10. It is not uncommon for the power consumption from the clock tree 18 alone to account for more than 30% of the total power consumption.

It would be desirable to have asynchronous low-swing differential repeaters that may be inserted along a wire to enable more optimal fine-tuning of transistor size and wire length. A clockless on-chip global interconnect design would be desirable to further reduce power consumption, improve signal integrity, and eliminate design dependency on clock duty cycle.

SUMMARY OF THE INVENTION

The present invention concerns an apparatus including a first circuit, a second circuit and a third circuit. The first circuit may be configured to (a) receive (i) a plurality of input signals and (ii) a clock signal and (b) present (i) a plurality of low-swing differential signals and (ii) a full-swing differential signal. The second circuit may be configured to (a) receive (i) the plurality of low-swing differential signals, (ii) the full-swing differential signal and (iii) the clock signal and (b) present a plurality of output signals. The third circuit may be configured to communicate the plurality of low-swing differential signals and the full-swing differential signal from the first circuit to the second circuit. The third circuit may be further configured to generate a local clock in response to the full-swing differential signal.

The objects, features and advantages of the present invention include providing low power on-chip global interconnects that may (i) use a clock at an input port and an output port to synchronize with an application specific integrated circuit (ASIC), (ii) apply small voltage swing techniques to all but one data line, (iii) generate a local clock from a full-swing data signal, (iv) activate sense amplifiers in one or more repeaters using the local clock, (v) transfer locally synchronous signals to a low-swing differential asynchronous global bus, (vi) eliminate global clock routed along with the datapath, (vii) eliminate clock power and noise, (viii) use a single edge of the local clock, (ix) be insensitive to clock duty cycle, (x) allow asynchronous repeaters (transceivers) to be added without half-cycle timing constraints, (xi) provide low power operation through clockless design and low-swing signaling, (xii) provide quiet operation through low-swing signaling, (xiii) provide good noise immunity through differential signaling, (xiv) be easy to integrate into traditional synchronous designs, (xv) implement handshake signals internally to the interconnect with no management from external circuitry, (xvi) be implemented in crossbar switches to provide any-to-any connectivity, (xvii) be implemented in on-chip master-slave buses for masters modules (e.g., on-chip processors) to share slave modules (common pool of resources such as on-chip memory and external I/O interfaces) and/or (xviii) reduce power consumption when data transmission is disabled.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention generally provides a new on-chip global interconnect methodology that uses a clock at only input and output ports to synchronize a global interconnect with an application specific integrated circuit (ASIC). The present invention also provides a clockless core crossbar switch that may be implemented without using a balanced clock tree in the switch core. The clock in the input port and the output port may be preserved to synchronize data flow through the crossbar switch with the ASIC. Long wires of the ASIC may be segmented into several segments and each segment driven by a clockless repeater in accordance with the present invention. Small voltage swing techniques may be applied to all data signals except one, which may have full-swing signals. The full-swing data signals may be used to generate a local clock. Sense amplifiers in the clockless repeaters may be activated using the local clock. When data transmission is disabled, no local clock is generated, saving power.

Figure 2:
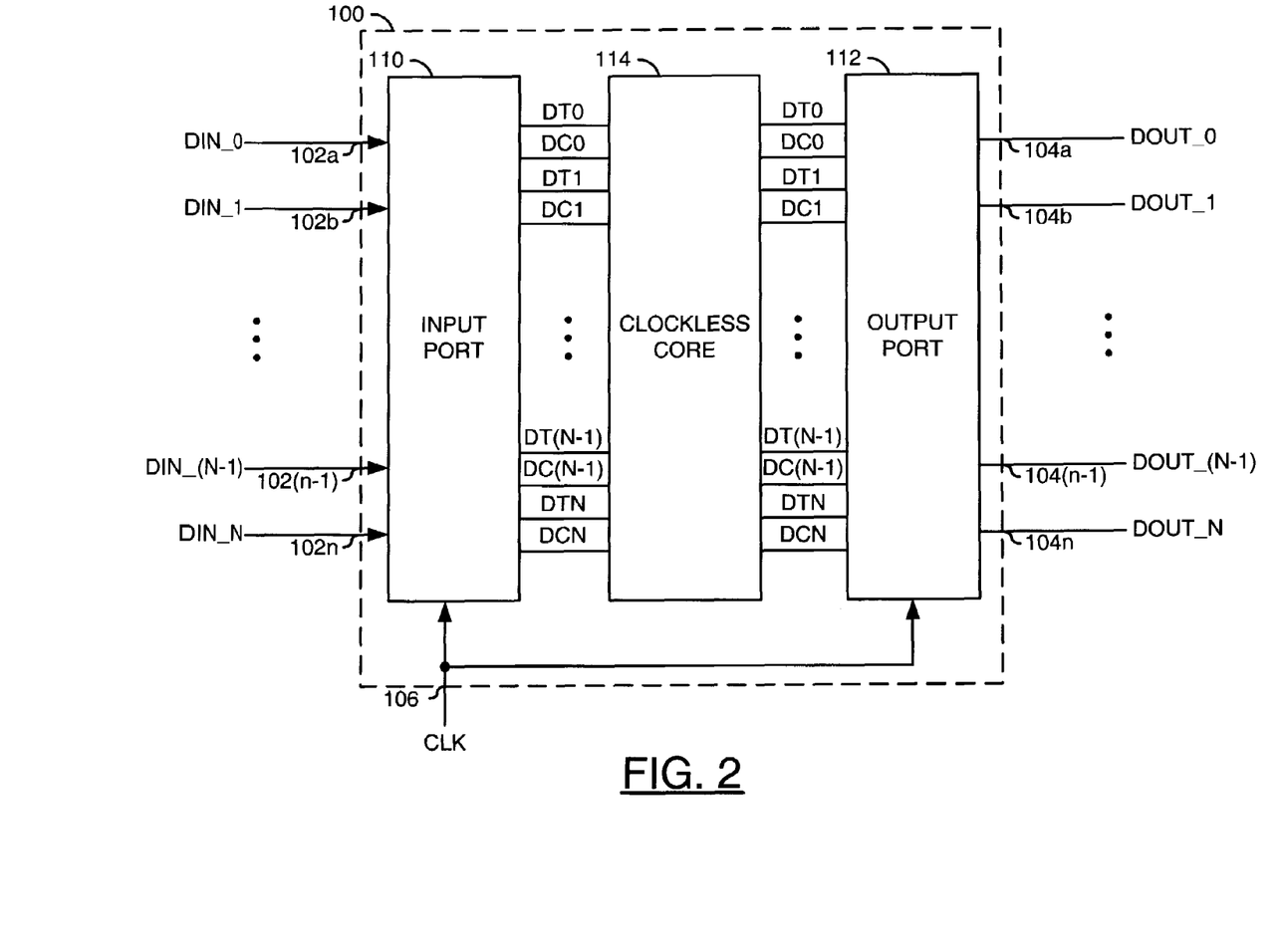
FIG. 2 is a block diagram illustrating a clockless interconnect in accordance with the present invention.

Referring to FIG. 2, a block diagram is shown illustrating a clockless interconnect 100 implemented in accordance with the present invention. The clockless interconnect 100 may have a number of inputs 102a-102n that may receive a number of input signals (e.g., DIN_0-DIN_N), a number of outputs 104a-104n that may present a number of output signals (e.g., DOUT_0-DOUT_N) and a clock input 106 that may receive a clock signal (e.g., CLK). The clockless interconnect 100 may be configured to communicate the input signals DIN_0-DIN_N from the inputs 102a-102n to the outputs 104a-104n for presentation as the signals DOUT_0-DOUT_N.

In one example, the clockless interconnect 100 may comprise a first portion (or circuit) 110, a second portion (or circuit) 112 and a third portion (or circuit) 114. The first portion 110 may be implemented as an input port. The second portion 112 may be implemented as an output port. The third portion 114 may be implemented, in one example, as a clockless core. The input port 110 and the output port 112 may both be triggered by the clock signal CLK. The clockless core 114 does not generally receive the clock signal CLK.

The input port 110 may convert the input data signals DIN_0-DIN_N into true and complementary signals (e.g., DT0-DTN and DC0-DCN, respectively). The true and complementary signals may be driven onto the wires of the clockless core 114. The clockless core 114 may propagate the true and complementary signals from respective outputs of the input port 110 to respective inputs of the output port 112. The output port 112 may convert the true signals DT0-DTN and the complementary signals DC0-DCN into the output data signals DOUT_0-DOUT_N, respectively.

The wires carrying both the true and the complementary signals may be pre-charged to a supply voltage level (e.g., VDD). When the clock signal CLK transitions to a HIGH (or logic "1") state, either the true signal or the complementary signal corresponding to each of the input signals DIN_0-DIN_(N-1) may discharge for a limited time. The discharge may produce a small voltage swing differential between the respective low-swing true and low-swing complementary signal pairs (e.g., DT0 and DC0, DT1 and DC1, . . . , DT(N-1) and DC(N-1)). In contrast, the true or the complementary signal corresponding to the input signal DIN_N may be fully discharged to a power supply ground potential (e.g., GND) producing a full-swing differential between the true signal DTN and the complementary signal DCN.

Figure 3:
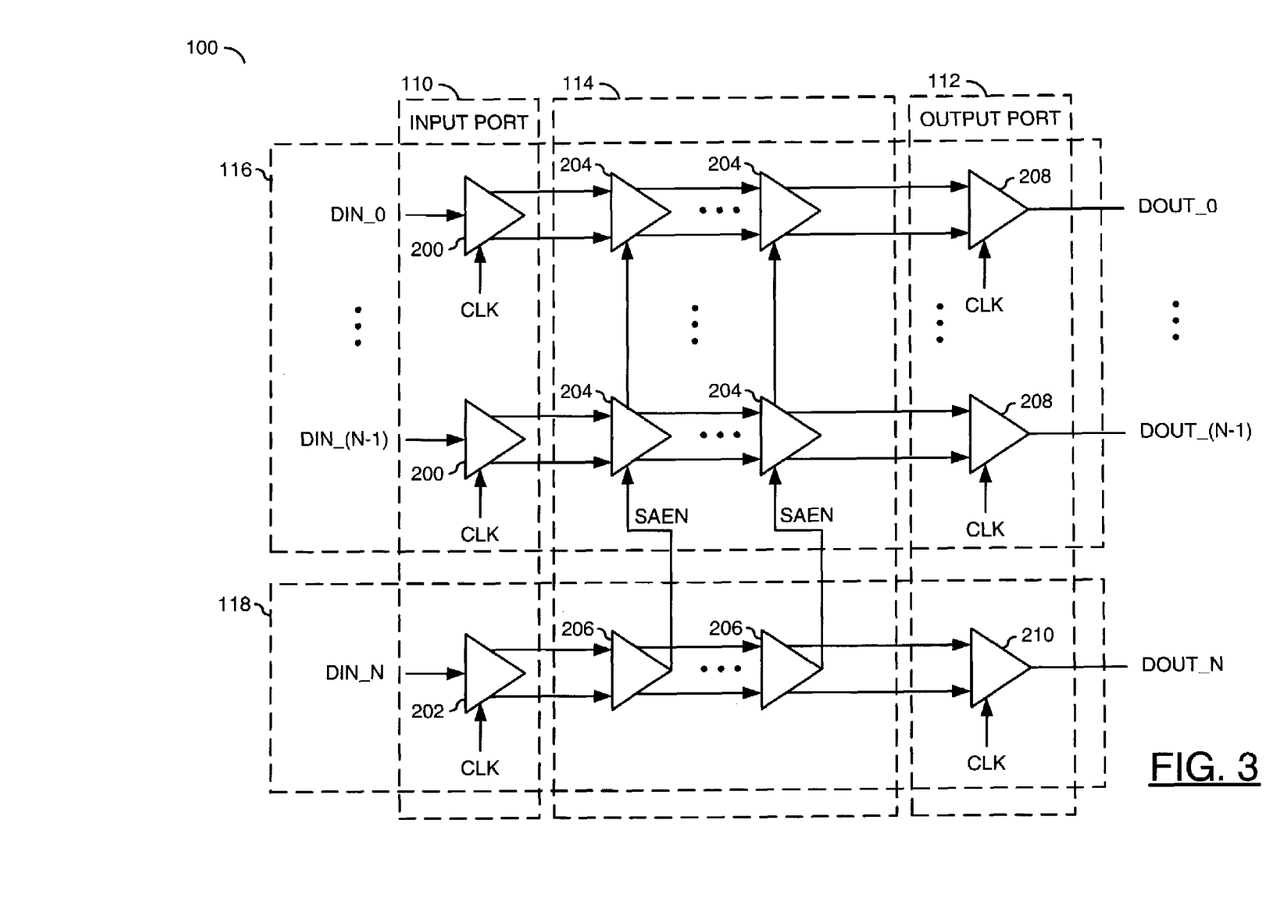
FIG. 3 is a block diagram illustrating the clockless interconnect of FIG. 2 implemented in accordance with a preferred embodiment of the present invention.

Referring to FIG. 3, a block diagram is shown illustrating the clockless interconnect 100 of FIG. 2 implemented in accordance with a preferred embodiment of the present invention. The clockless interconnect 100 may comprise a low-swing portion 116 and a full-swing portion 118. The full-swing portion 118 comprises a single data path. The low-swing portion 116 includes all remaining data paths of the interconnect 100.

The input port 110 may comprise a number of low-swing drivers 200 and a full-swing driver 202. The drivers 200 may convert the input data signals on the low-swing data paths (e.g., DIN_0-DIN_(N-1)) into the true signals DT0-DT(N-1) and the complementary signals DC0-DC(N-1), respectively. The driver 202 may convert the input data signal on the full-swing data path (e.g., DIN_N) into the true signal DTN and the complementary signal DCN.

Each wire in the data paths of the clockless core 114 may be partitioned (segmented) into two or more segments. Partitioning the wires generally reduces the propagation delay. The segments of the low-swing portion 116 may be coupled by low-swing repeaters 204. The segments of the full-swing portion 118 may be coupled by full-swing repeaters 206. In one example, the full-swing repeaters 206 may include local clock generating circuitry. In another example, local clock generating circuitry may be implemented separately from the full-swing repeaters. Each segment of the clockless core 114 may be driven by either an output from one of the drivers 200 or 202 or one of the repeaters 204 or 206.

The output port 112 may comprise a number of low-swing receivers 208 and a full-swing receiver 210. The receivers 208 may convert respective pairs of the low-swing true signals DT0-DT(N-1) and the low-swing complementary signals DC0-DC(N-1) into the output data signals DOUT_0-DOUT_(N-1), respectively. The receiver 210 may convert the full-swing true signal DTN and the full-swing complementary signal DCN into the output data signal DOUT_N.

The repeaters 206 that propagate the true signal DTN and the complementary signal DCN are configured to receive a pair of full-swing signals and generate (i) a pair of full-swing signals and (ii) a signal (e.g., SAEN). The signal SAEN may be implemented as a local clock, control or enable signal. The signal SAEN from each of the repeaters 206 of the full-swing path 118 may be presented to inputs of repeaters 204 at a corresponding point in the low-swing paths of the portion 116. The repeaters 204 propagate the true signals DT0-DT(N-1) and the complementary signals DC0-DC(N-1) in response to the respective signals SAEN. Although the signal DIN_N is shown as the full-swing path, any of the input signals may be used accordingly as the full-swing path. Each of the respective signals SAEN may enable sense amplifiers within the corresponding repeaters 204 and 206.

Figure 4:
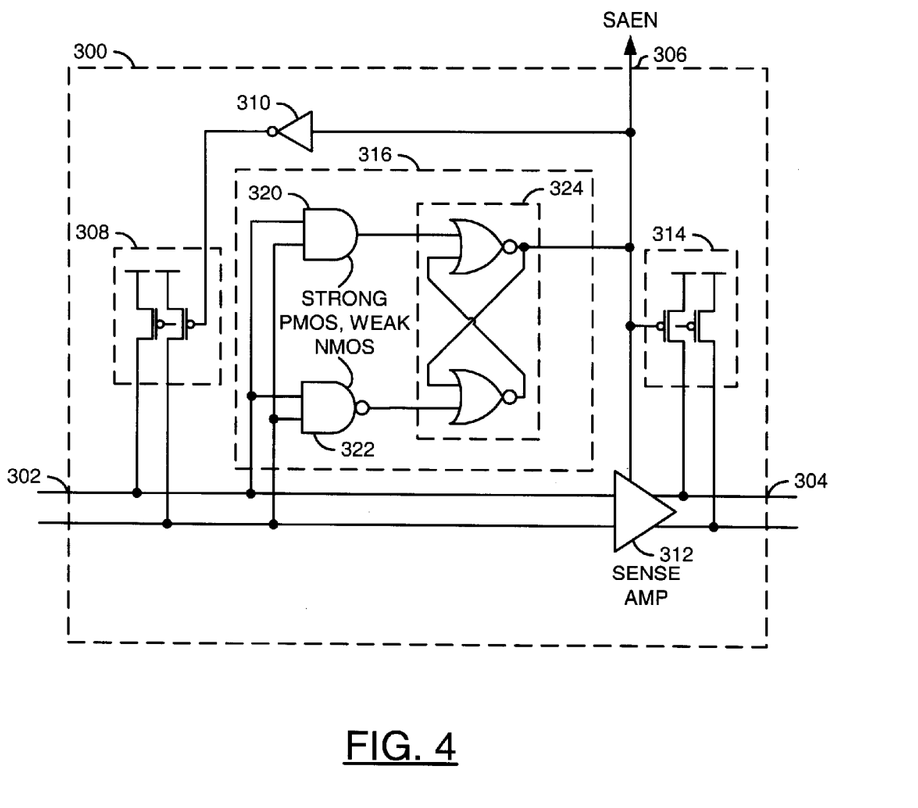
FIG. 4 is a diagram illustrating a clockless repeater in accordance with an embodiment of the present invention.

Referring to FIG. 4, a diagram is shown illustrating a clockless repeater 300 in accordance with a preferred embodiment of the present invention. The clockless repeater 300 may be used, for example, to implement the repeaters 206 in the clockless core 114 that propagate the full-swing signals and generate the signal SAEN.

The clockless repeater 300 may have a differential input 302, a differential output 304 and an output 306. The input 302 may connect the repeater 300 to a first segment of the full-swing data path. The output 304 may connect the repeater 300 to a second segment of the full-swing data path. The signal SAEN may be presented at the output 306. The clockless repeater 300 may be configured to generate the signal SAEN in response to a differential signal received at the input 302.

The clockless repeater 300 may comprise a block 308, a block 310, a block 312, a block 314 and a block 316. The block 308 may be implemented as a pull-up device. The block 310 may be implemented as a logic gate. In one example, the block 310 may be implemented as an inverter. The block 312 may be implemented as a sense amplifier. The block 312 is generally implemented similarly to sense amplifiers used within the repeaters of the low-swing portion 116 to mimic a similar delay. The block 314 may be implemented as a pull-up device. The block 316 may be implemented as a local clock generator.

In one example, the block 308 and 314 may be implemented with a plurality of small PMOS transistors. The transistors of the block 308 may be configured to pull-up the wires of the differential input 302 to a supply voltage (e.g., VDD). The transistors of the block 314 may be configured to pull-up the wires of the differential output 302 to the supply voltage. A gate terminal of each of the transistors of the block 308 may be connected to an output of the block 310. The signal SAEN may be presented to an input of the block 310, an input of the block 312 and a gate of each of the transistors of the block 314.

The block 316 may have a differential input that may be connected to the input 302 and an output the may present the signal SAEN. The block 316 may be configured to generate the signal SAEN in response to a full-swing differential signal received from the input 302. In one example, the block 316 may comprise a block (or circuit) 320, a block (or circuit) 322 and a block (or circuit) 324. The block 320 may be implemented, in one example, as an AND gate. The block 322 may be implemented, in one example, as a NAND gate. The block 324 may be implemented as set and reset asynchronous latch. In one example, the block 324 be implemented with a pair of NOR gates.

Both of the blocks 320 and 322 may receive the full-swing true and complementary signals from the differential input 302. After a power-on reset, the full-swing data path may be pre-charged to VDD by the blocks 308 and 314. The signal SAEN generally remains in a LOW, or logic "0" state. When the data is driven onto the wires, one of the true and complementary signals transitions to a LOW state. The propagation delay on the full-swing data path and the low-swing data path may be engineered to be substantially equal (e.g., by setting strong PMOS transistors and weak NMOS transistors in the blocks 320 and 322, a bigger metal width or a larger metal spacing). The block 322 asserts the signal SAEN (e.g., a HIGH or logic 1 state) via the block 324. The signal SAEN enables the sense amplifiers of the low-swing data paths.

Simulation may be done to ensure that the voltage differential on the low-swing wires is sufficient before enabling the sense amplifiers. Since low-swing differential signaling is used on N−1 wires and only the Nth wire uses full-swing signaling, the block 316 is configured to ensure that enough of a voltage differential between the true and complement lines is developed for the N−1 wires before the differential sense amplifiers are turned ON with the enable signal SAEN. When a differential signal travels over a long distance on-chip, the differential voltage generally develops (increases) slowly at the far end due to on-chip wire impedance. The differential voltage development takes time. Longer wires and/or shorter pulse widths of the signal SAEN generally lead to longer differential voltage development time. If sufficient differential voltage is not developed, the differential sense amplifiers of the low-swing paths may be turned ON prematurely with an input differential signal below the sensitivity of the amplifiers. In other words, while garbage (or noise) is presented to the differential amplifiers.

In response to the assertion of the signal SAEN, the block 308 starts to pre-charge the full-swing wires connected to the differential input 302. The low-swing wires of the other N−1 data paths are pre-charged as well by similar pre-charge devices. The block 314 is disabled by assertion of the signal SAEN. The pre-charge time may be set to meet design criteria of a particular implementation by using small PMOS transistors in the block 308 and setting strong PMOS and weak NMOS in the block 320. For example, the pre-charge time may be set such that the data driven by the block 312 may reach the receiver without being disturbed by the block 314. The process may be repeated by each repeater along the data path until the data reaches the output port 112.

The present invention generally provides a low power clockless on-chip global interconnect. Data going into the clockless on-chip global interconnect is synchronous, but the interconnect itself does not carry an explicit clock. The clockless interconnect may extract timing information from the data using differential signaling. The extracted clock may be used to enable on-chip low-swing differential transceivers. Clockless repeaters may be inserted at optimal locations on the wires.

Data on an N-bit synchronous bus may be transferred onto an asynchronous global interconnect in accordance with the present invention by extracting timing information from one of the N bits designated as a master data signal. Timing information implied in the master data signal may be used to drive self-timed low-swing differential transceivers for the remaining N−1 bits on the bus.

It will be apparent to those skilled in the field of the present invention that low-swing differential transceivers may be cascaded along the signal path until the signals reach the desired location on the chip. In general, the present invention may use a single edge (e.g., the positive edge) of the clock at the near end of the bus. The present invention may eliminate sensitivity to the duty cycle of the clock. Also, repeater insertion is not restrained to propagate a signal from one repeater to the next within half a clock cycle. In general, the present invention may allow a designer to avoid over designing a circuit to cover timing margin lost due to a two-phase design with a non-50% duty cycle clock.

Figure 5:
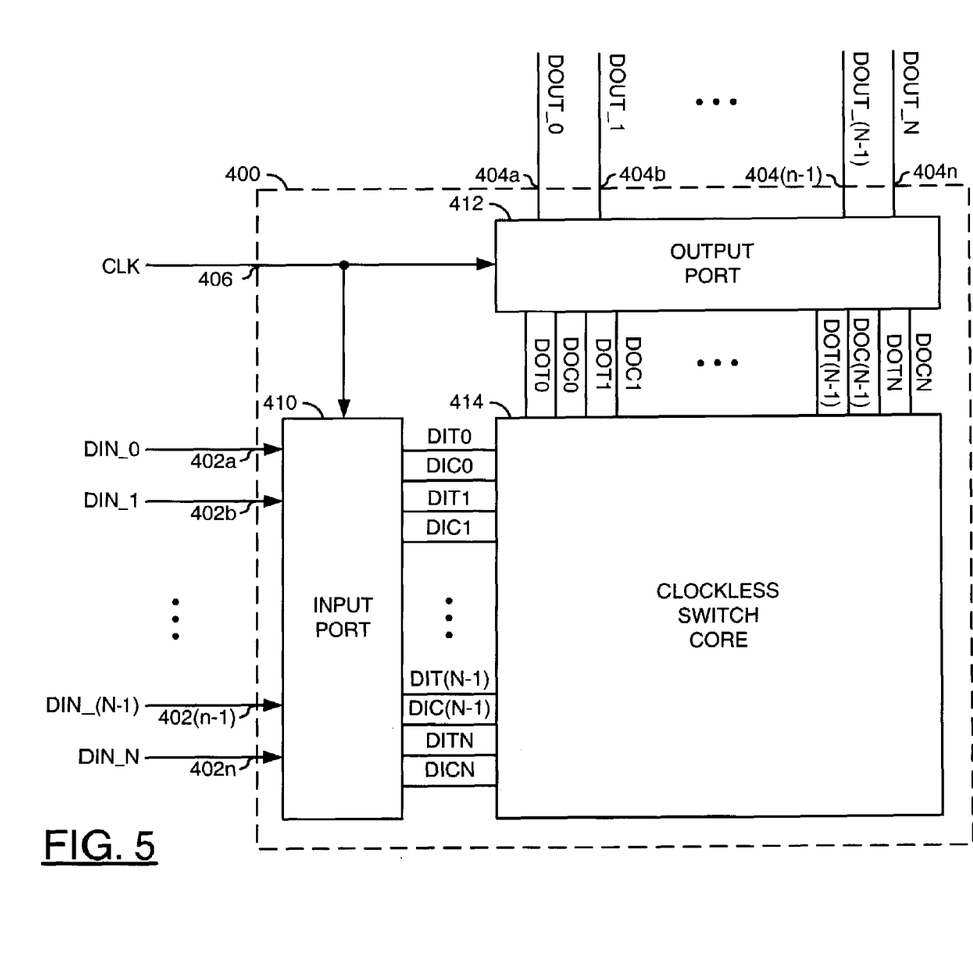
FIG. 5 is a block diagram illustrating a crossbar switch with a clockless switch core in accordance with the present invention.

Referring to FIG. 5, a block diagram is shown illustrating a crossbar switch 400 implemented in accordance with the present invention. The crossbar switch 400 may have a number of inputs 402a-402n that may receive a number of input signals (e.g., DIN_0-DIN_N), a number of outputs 404a-404n that may present a number of output signals (e.g., DOUT_0-DOUT_N) and a clock input 406 that may receive a clock signal (e.g., CLK). The crossbar switch 400 may be configured to direct the input signals DIN_0-DIN_N from the inputs 402a-402n to any of the outputs 404a-404n for presentation as the signals DOUT_0-DOUT_N. In one example, the crossbar switch 400 may direct the signals based upon addresses (or select signals) provided by a system arbitrator (not shown).

In one example, the crossbar switch 400 may comprise a first portion (or circuit) 410, a second portion (or circuit) 412 and a third portion (or circuit) 414. The first portion 410 may be implemented as an input port. The second portion 412 may be implemented as an output port. The third portion 414 may be implemented, in one example, as a clockless switch core. The input port 410 and the output port 412 may both be triggered by the clock signal CLK. The clockless switch core 414 does not generally receive the clock signal CLK.

The input port 410 may convert the input data signals DIN_0-DIN_N into true and complementary input signals (e.g., DIT0-DITN and DIC0-DICN, respectively). The true and complementary signals may be driven onto wires of the clockless switch core 414. The clockless switch core 414 may propagate and route the true and complementary signals to respective inputs of the output port 412 as true and complementary output signals (e.g., DOT0-DOTN and DOC0-DOCN, respectively). In one example, the output port 412 may convert pairs of the true signals DOT0-DOTN and the complementary signals DOC0-DOCN into the output data signals DOUT_0-DOUT_N, respectively.

Both the true and the complementary signals may be pre-charged to a supply voltage level (e.g., VDD). When the clock signal CLK transitions to a HIGH (or logic "1") state, either the true signal or the complementary signal corresponding to each of the input signals DIN_0-DIN_(N-1) may discharge for a limited time. The discharge may produce a small voltage swing differential between the true and complementary signals. In contrast, the true or the complementary signal corresponding to the input signal DIN_N may be fully discharged to a power supply ground potential (e.g., GND) producing a full-swing differential between the true signal DITN and the complementary signal DICN.

Figure 6:
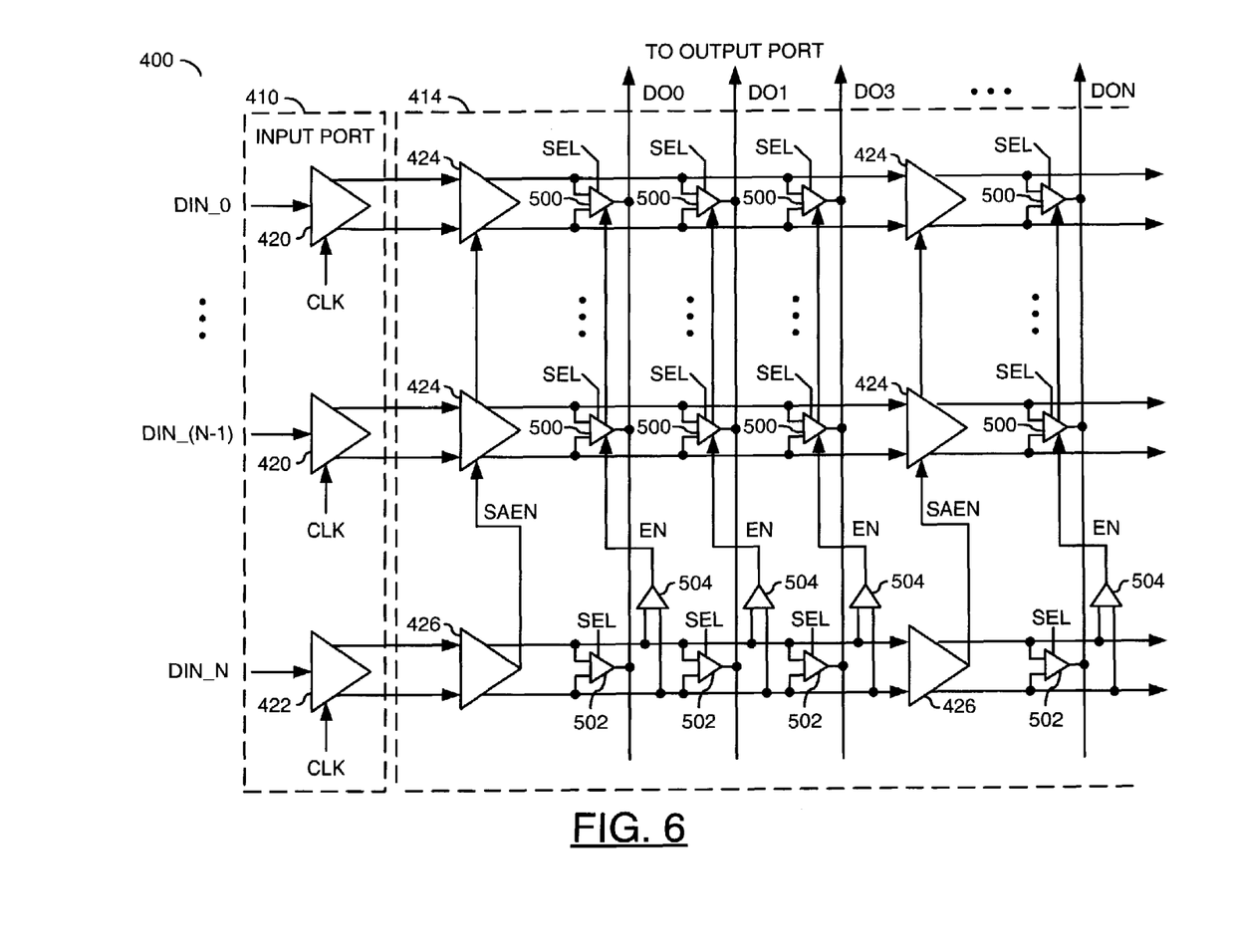
FIG. 6 is a block diagram illustrating the crossbar switch of FIG. 5 implemented in accordance with a preferred embodiment of the present invention.

Referring to FIG. 6, a block diagram is shown illustrating the crossbar switch 400 of FIG. 5 implemented in accordance with another preferred embodiment of the present invention. The input port 410 may comprise a number of low-swing drivers 420 and a full-swing driver 422. The drivers 420 and 422 may be implemented similarly to the drivers 200 and 202, respectively (described above in connection with FIG. 3). The drivers 420 may convert the input data signals DIN_0-DIN_(N-1) into the true signals DIT0-DIT(N-1) and the complementary signals DIC0-DIC(N-1), respectively. The driver 422 may convert the signal DIN_N into the true signal DITN and the complementary signal DICN.

Each wire in the switch core 414 may be partitioned (segmented) into two or more segments to reduce the propagation delay. Each segment may be driven by either an output from one of the drivers 420 or 422, a low-swing repeater 424 or a full-swing repeater 426. The repeaters 424 and 426 may be implemented similarly to the repeaters 204 and 206, respectively (described above in connection with FIG. 3). In one example, the output port 412 may be implemented similarly to the output port 112 (described above in connection with FIG. 3). For example, receivers in the output port 412 may convert the true signals DOT0-DOTN and the complementary signals DOC0-DOCN into the output data signals DOUT_0-DOUT_N, respectively (as illustrated in FIG. 5).

In another example, the clockless switch core 414 may be configured to present single-ended output signals (e.g., DO0-DON). For example, low-swing tri-statable buffers 500 may be placed between repeaters 424 in the low-swing data paths corresponding to the signals DIN_0-DIN_(N-1) and full-swing tri-statable buffers 502 may be placed between repeaters 426 in the full-swing data path corresponding to the signal DIN_N. Outputs of the buffers 500 and 502 in each column of the clockless switch core 414 may be coupled together forming an output bus that may present the respective output signals DO0-DON. The buffers 500 and 502 in each column of the clockless switch core 414 may be implemented with a one hot configuration (e.g., only one buffer in each column is enabled at a given time).

An enable generator block (or circuit) 504 may be associated with each column in the clockless switch core 414. The enable generator circuit 504 may have a differential input that may receive a full-swing differential signal from the full-swing data path and an output that may present a signal (e.g., EN). The enable generator circuit 504 may be configured to generate the signal EN in response to the full-swing differential signal. The signal EN may be implemented as a local clock, control or enable signal. The signal EN may be presented to a control input of each of the low-swing tri-statable buffers 500. In one example, the enable generator circuit 504 may be implemented similarly to the block 316 in FIG. 4.

The buffers 500 and 502 may also have a control input that may receive a signal (e.g., SEL). The signal SEL may be implemented as a control or select signal. In one example, the signal SEL may comprise address signals for directing the inputs of the clockless switch core 414 to the appropriate outputs. The signal SEL may be implemented, for example, as a multi-bit (parallel or serial) signal, a plurality of single bit signals, a plurality of configuration bits, or other appropriate signal for individually and/independently controlling the buffers 500 and 502. The signal SEL may be statically programmed (e.g., fixed or set during an initialization process) or dynamically varied (e.g., programmable on the fly).

Features and advantages of the present invention may include providing low power on-chip global interconnects that may: transfer locally synchronous signals to a global low-swing differential asynchronous bus; eliminate routing of a global clock along with the datapath; eliminate clock power and noise; use only the positive edge of the local clock; be insensitive to clock duty cycle; allow asynchronous repeaters (transceivers) to be added without concern for half-cycle timing constraints (e.g., minus clock cycle duty distortion); provide low power operation through a clockless design and low-swing signaling; provide quiet operation due to low-swing signaling; provide good noise immunity through differential signaling; be easy to integrate into traditional synchronous designs because the interfaces are still synchronous; implement handshake signals that are internal to the interconnect with no management from external circuitry. The present invention may be used, for example, by (i) crossbar switches to provide any-to-any connectivity and (ii) on-chip master-slave buses for masters modules (e.g., on-chip processors) to share slave modules (e.g., common pool of resources such as on-chip memory and external I/O interfaces).

While the invention has been particularly shown and described with reference to the preferred embodiments thereof, it will be understood by those skilled in the art that various changes in form and details may be made without departing from the scope of the invention.

The invention claimed is:

1. An apparatus comprising:
    a first circuit configured to (a) receive (i) a plurality of input signals and (ii) a clock signal and (b) present (i) a plurality of low-swing differential signals and (ii) a full-swing differential signal;
    a second circuit configured to (a) receive (i) the plurality of low-swing differential signals, (ii) the full-swing differential signal and (iii) the clock signal and (b) present a plurality of output signals; and
    a third circuit configured to communicate the plurality of low-swing differential signals and the full-swing differential signal from the first circuit to the second circuit, wherein the third circuit is further configured to generate a local clock in response to the full-swing differential signal.

2. The apparatus according to claim 1, wherein said apparatus is part of an on-chip global interconnect.

3. The apparatus according to claim 1, wherein said apparatus is part of a crossbar switch.

4. The apparatus according to claim 1, wherein said third circuit comprises a pair of wires for each of said plurality of low-swing differential signals and said full-swing differential signal.

5. The apparatus according to claim 4, wherein each pair of wires carrying one of said plurality of low-swing differential signals is divided into a plurality of segments and each of said plurality of segments is driven by a clockless repeater.

6. The apparatus according to claim 5, wherein said clockless repeater comprises a sense amplifier and said sense amplifier is enabled in response to a control signal generated in response to said full-swing differential signal.

7. The apparatus according to claim 6, wherein said control signal comprises said local clock.

8. The apparatus according to claim 4, wherein the pair of wires carrying said full-swing differential signal is divided into a plurality of segments and each of said plurality of segments is driven by a clockless repeater.

9. The apparatus according to claim 8, wherein said clockless repeater comprises:
a set and reset asynchronous latch;
a NAND gate having an output coupled to a first input of said set and reset asynchronous latch and a pair of inputs receiving said full-swing differential signal; and
an AND gate having an output coupled to a second input of said set and reset asynchronous latch and a pair of inputs receiving said full-swing differential signal, wherein said local clock is presented at an output of said set and reset asynchronous latch in response to transitions of said full-swing differential signal.

10. The apparatus according to claim 8, further comprising:
a plurality of low-swing tristatable buffers configured to generate an output signal in response to a low-swing differential input signal, a select signal and an enable input;
a plurality of full-swing tristatable buffers configured to generate an output signal in response to a full-swing differential input signal and a select signal; and
a plurality of enable circuits, each enable circuit configured to generate a respective enable signal in response to a full-swing differential input signal, wherein said plurality of low-swing and said plurality of full-swing tristatable buffers are arranged in a number of columns, each of said enable circuits is associated with one of said columns and each respective enable signal is present to the enable input of the low-swing tristatable buffers of the respective column.

11. The apparatus according to claim 10, wherein said enable circuit comprises:
a set and reset asynchronous latch;
a NAND gate having an output coupled to a first input of said set and reset asynchronous latch and a pair of inputs receiving said full-swing differential signal; and
an AND gate having an output coupled to a second input of said set and reset asynchronous latch and a pair of inputs receiving said full-swing differential signal, wherein said enable signal is presented at an output of said set and reset asynchronous latch in response to transitions of said full-swing differential signal.

12. The apparatus according to claim 10, wherein said select signal is programmable.

13. An apparatus comprising:
means for (a) receiving (i) a plurality of input signals and (ii) a clock signal and (b) presenting (i) a plurality of low-swing differential signals and (ii) a full-swing differential signal;
means for (a) receiving (i) the plurality of low-swing differential signals, (ii) the full-swing differential signal and (iii) the clock signal and (b) presenting a plurality of output signals; and
means for communicating the plurality of low-swing differential signals and the full-swing differential signal from the first means for receiving and presenting to the second means for receiving and presenting, wherein the means for communicating is further configured to generate a local clock in response to the full-swing differential signal.

14. A method for reducing power consumption in on-chip global interconnects comprising the steps of:
(A) receiving (i) a plurality of input signals and (ii) a clock signal at an input port;
(B) generating (i) a plurality of low-swing differential signals and (ii) a full-swing differential signal in response to the plurality of input signals and the clock signal; and
(C) generating a plurality of output signals at an output port in response to the plurality of low-swing differential signals, the full-swing differential signal and the clock signal, wherein (i) a local clock is generated in response to the full-swing differential signal and (ii) the plurality of low-swing differential signals and the full-swing differential signal are communicated through a on-chip global interconnect from the input port to the output port in response to the local clock.

15. The method according to claim 14, wherein said on-chip global interconnect comprises a pair of wires for each of said plurality of low-swing differential signals and said full-swing differential signal.

16. The method according to claim 15, wherein each pair of wires carrying one of said plurality of low-swing differential signals is divided into a plurality of segments and each of said plurality of segments is driven by a clockless repeater.

17. The method according to claim 16, wherein said clockless repeater comprises a sense amplifier and said sense amplifier is enabled in response to a control signal generated in response to said full-swing differential signal.

18. The method according to claim 17, wherein said control signal comprises said local clock.

19. The method according to claim 15, wherein the pair of wires carrying said full-swing differential signal is divided into a plurality of segments and each of said plurality of segments is driven by a clockless repeater.

20. The method according to claim 19, wherein said clockless repeater comprises:
a set and reset asynchronous latch;
a NAND gate having an output coupled to a first input of said set and reset asynchronous latch and a pair of inputs receiving said full-swing differential signal; and
an AND gate having an output coupled to a second input of said set and reset asynchronous latch and a pair of inputs receiving said full-swing differential signal, wherein said local clock is presented at an output of said set and reset asynchronous latch in response to transitions of said full-swing differential signal.

* * * * *